US010615750B1

(12) United States Patent
Gupta et al.

(10) Patent No.: US 10,615,750 B1
(45) Date of Patent: Apr. 7, 2020

(54) PREAMPLIFIER CIRCUIT WITH FLOATING TRANSCONDUCTOR

(71) Applicant: NXP B.V., Eindhoven (NL)

(72) Inventors: Sushil Kumar Gupta, Bangalore (IN); Hitesh Kumar Garg, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/202,107

(22) Filed: Nov. 28, 2018

(51) Int. Cl.
*H03F 1/02* (2006.01)
*H03K 5/24* (2006.01)
*H03F 3/45* (2006.01)

(52) U.S. Cl.
CPC ....... *H03F 1/0205* (2013.01); *H03F 3/45475* (2013.01); *H03K 5/24* (2013.01); *H03F 2200/129* (2013.01)

(58) Field of Classification Search
CPC .............. H03F 3/005; H03F 3/45; H03F 1/02
USPC .............................................. 330/9, 260, 107
See application file for complete search history.

(56) References Cited

U.S. PATENT DOCUMENTS

| 5,491,447 | A | 2/1996 | Goetschel et al. |
| 6,175,462 | B1 | 1/2001 | Chung et al. |
| 6,831,507 | B2 | 12/2004 | Granville |
| 7,154,294 | B2 | 12/2006 | Liu et al. |
| 7,265,609 | B2 | 9/2007 | Hughes |
| 2002/0175716 | A1 | 11/2002 | Cyrusian |
| 2011/0140782 | A1* | 6/2011 | Bofill-Petit ......... H03F 3/45197 330/252 |
| 2017/0040959 | A1* | 2/2017 | Mora-Puchalt ....... H03F 1/0205 |

OTHER PUBLICATIONS

Y. Shimizu, S. Murayama, Kohhei Kudoh, H. Yatsuda, A. Ogawa, "A 30mW 12b 40MS/s Subranging ADC with a High-Gain Offset-Canceling Positive-Feedback Amplifier in 90nm Digital CMOS," 2006 IEEE International Solid State Circuits Conference—Digest of Technical Papers, San Francisco, CA, USA, Feb. 2006, pp. 216-217.

Dan J. Huber, Rodney J. Chandler, Asad A. Abidi, "A 10b 160MS/s 84mW 1V Subranging ADC in 90nm CMOS", 2007 IEEE International Solid-State Circuits Conference—Digest of Technical Papers, San Francisco, CA, USA, Feb. 2007, pp. 454-615.

* cited by examiner

*Primary Examiner* — Steven J Mottola

(74) *Attorney, Agent, or Firm* — Rajeev Madnawat

(57) ABSTRACT

A preamplifier circuit includes a first transconductor and a floating transconductor. The first transconductor receives a differential voltage from a sample-and-hold circuit and drives the floating transconductor. The first and floating transconductors output amplified versions of the differential voltage that are not affected by capacitive division, which makes the preamplifier circuit fast. The preamplifier circuit also has a low input capacitance because the floating transconductor is not connected to any external circuitry.

17 Claims, 3 Drawing Sheets

PREAMPLIFIER CIRCUIT WITH FLOATING TRANSCONDUCTOR

BACKGROUND

The present invention relates generally to preamplifier circuits, and, more particularly, to a preamplifier circuit with capacitive, positive feedback.

Clocked comparators are used for Analog-to-Digital converters (ADCs), which convert analog voltages to digital voltages by sampling the analog voltages. A preamplifier circuit is needed to prevent offset and kickback noise. A clocked preamplifier is fast due to timed operation of distinct phases in the amplification process. A high-speed preamplifier can be achieved, but at the cost of increased power. High current in the preamplifier also causes an increase in the size of its input capacitor, which leads to accuracy issues as well as additional circuit area.

It would be advantageous to have an accurate, high-speed preamplifier circuit that does not consume extra current.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
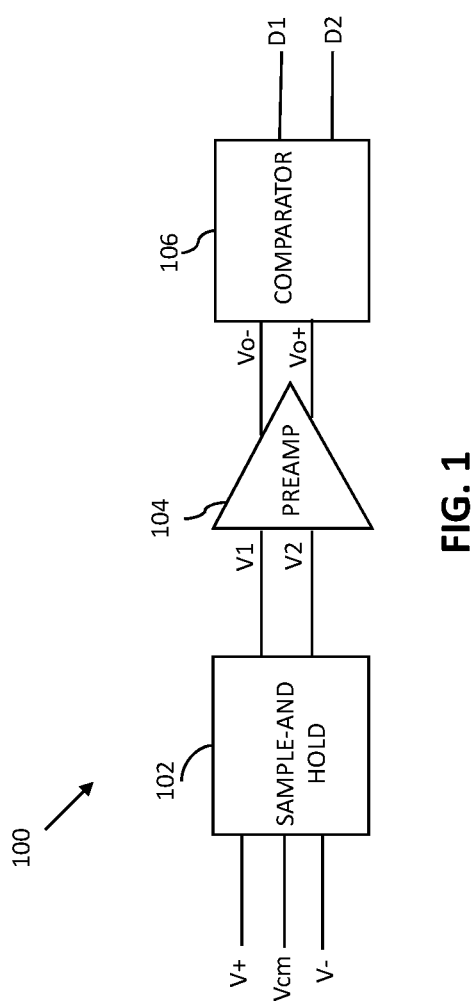
FIG. 1 is a schematic block diagram of an analog-to-digital converter (ADC) in accordance with an embodiment of the present invention.

The detailed description of the appended drawings is intended as a description of the currently preferred embodiments of the present invention and is not intended to represent the only form in which the present invention may be practiced. It is to be understood that the same or equivalent functions may be accomplished by different embodiments that are intended to be encompassed within the spirit and scope of the present invention.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transmission of electrical signals. In addition, when describing connections to transistors or other electrical components, usage of terms like gate, drain and source means the same as gate terminal, drain terminal and source terminal, so, for instance, gate and gate terminal may be used interchangeably.

The present invention provides a preamplifier circuit that has increased, passive positive feedback at its output to boost speed without adding extra current by adding a transconductor circuit with capacitive positive feedback at the output, where the capacitive feedback circuit is active only in an amplification mode.

In one embodiment, the present invention provides a preamplifier circuit that includes an input stage and a floating transconductor. The input stage includes a first transconductor and a load connected in parallel to the first transconductor. The first transconductor is connected to an external sample-and-hold circuit for receiving first and second voltages, while the floating transconductor is connected in parallel to the input stage for receiving amplified first and second voltages. The floating transconductor outputs amplified third and fourth voltages.

In another embodiment, the first transconductor has first and second input terminals connected to an external sample-and-hold circuit for receiving the first and second voltages, and first and second output terminals for outputting the amplified first and second voltages, respectively. The floating transconductor has third and fourth input terminals for receiving the amplified first and second voltages, and third and fourth output terminals for outputting the amplified third and fourth voltages, respectively. The third and fourth output terminals are connected to the first and second output terminals at first and second nodes, respectively. The preamplifier circuit outputs a first output voltage at the first node based on the amplified first and third voltages, and a second output voltage at the second node based on the amplified second and fourth voltages.

In yet another embodiment, the first transconductor includes first and second transistors and a first tail current source. The first transistor has a gate connected to an external sample-and-hold circuit for receiving a first voltage, and a drain for providing an amplified first voltage. The second transistor has a gate connected to the external sample-and-hold circuit for receiving a second voltage, a source connected to a source of the first transistor, and a drain for providing an amplified second voltage. The first tail current source receives a biasing voltage and outputs a first tail current to the source terminals of the first and second transistors. The floating transconductor includes third and fourth transistors and a second tail current source. The third transistor has a gate connected to the drain of the second transistor for receiving the amplified second voltage, and a drain that provides an amplified third voltage. The fourth transistor has a gate connected to the drain of the first transistor for receiving the amplified first voltage, a source connected to a source of the third transistor, and a drain that provides an amplified fourth voltage. The second tail current source receives the biasing voltage and outputs a second tail current to the source terminals of the third and fourth transistors. The preamplifier circuit outputs a first output voltage based on the amplified first and third voltages, and a second output voltage based on the amplified second and fourth voltages.

Various embodiments of the present invention provide a preamplifier circuit that includes a first transconductor and a floating transconductor. The first transconductor receives first and second voltages and outputs amplified first and second voltages. The floating transconductor receives the amplified first and second voltages by way of positive feedback paths and outputs amplified third and fourth voltages. The preamplifier circuit outputs a first output voltage based on the amplified first and third voltages, and a second output voltage based on the amplified second and fourth voltages.

The first and floating transconductors store their respective offset voltages to reduce the effect of offset noise at the preamplifier circuit output terminals. The preamplifier circuit has low input capacitance, so sizes of transistors in the first and floating transconductors are reduced, which means the area consumed by the preamplifier circuit is manageable. The positive feedback paths assist in enhancing a gain of the preamplifier circuit exponentially without consuming additional current. Further, due to the low input capacitance, the preamplifier circuit consumes less power than conventional preamplifier circuits.

Referring now to FIG. 1, a schematic block diagram of an analog-to-digital converter (ADC) 100, in accordance with an embodiment of the present invention is shown. The ADC 100 includes a sample-and-hold circuit 102, a preamplifier circuit 104, and a comparator 106.

The sample-and-hold circuit 102 receives a differential input voltage V+ and V− and a common-mode voltage Vcm. The sample-and-hold circuit 202 samples the input voltage V+ and V− and outputs a sampled differential voltage as V1 and V2.

The preamplifier circuit 104 is connected to the sample-and-hold circuit 102 and receives the sampled differential voltage V1, V2. In alternative embodiments, the preamplifier circuit 104 could receive the differential voltage V1, V2 from a continuous time amplifier, another preamplifier circuit, or some other analog circuitry that provides sampled analog voltages. The preamplifier circuit 104 generates and outputs an amplified differential voltage Vo− and Vo+.

The comparator 106 is connected to the preamplifier circuit 104 and receives the amplified differential voltage Vo− and Vo+. The comparator 106 compares the amplified voltage Vo− and Vo+ with a reference voltage (not shown), and outputs a digital differential voltage D1, D2.

Figure 2:
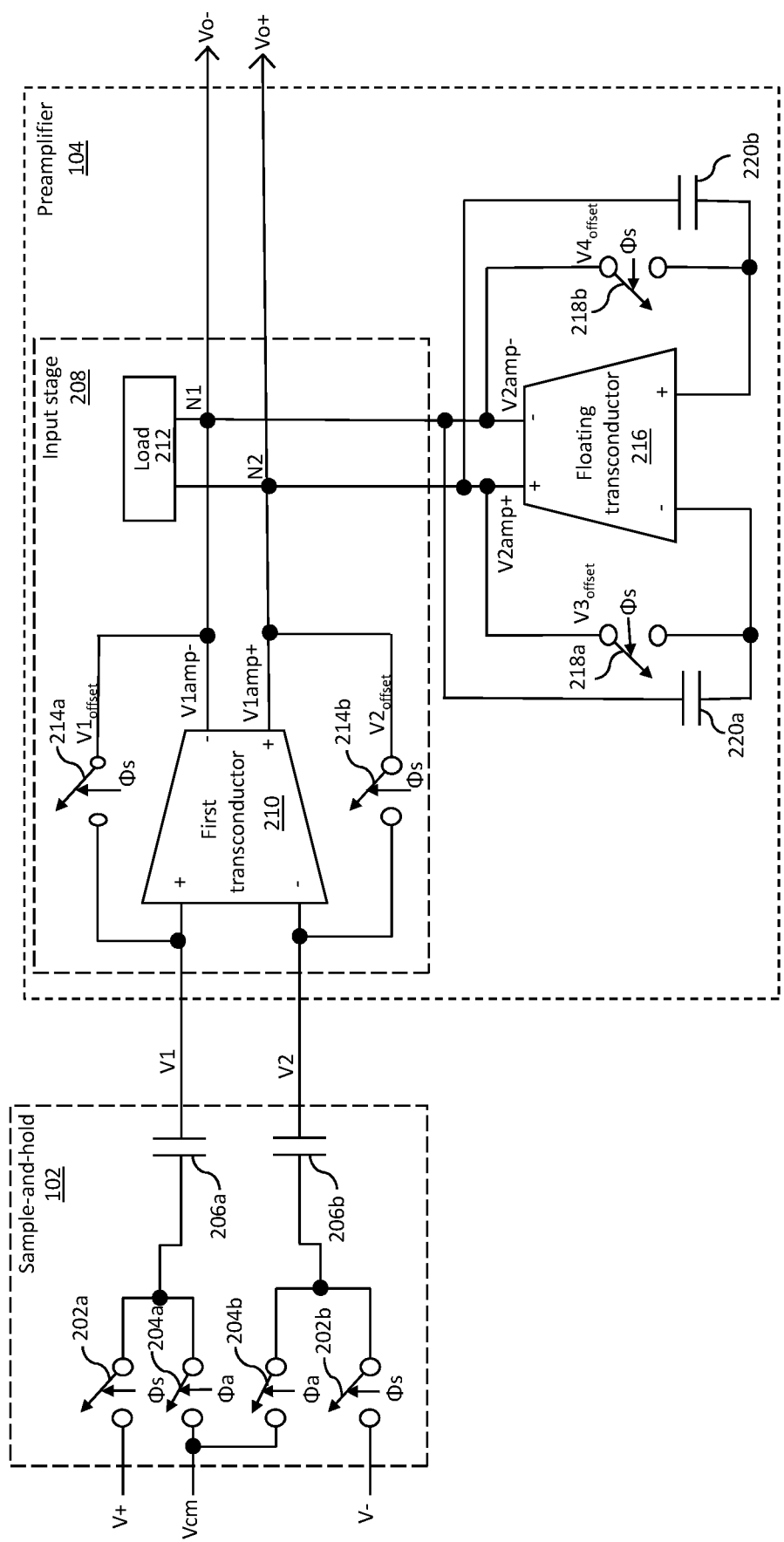
FIG. 2 is a schematic diagram of a preamplifier circuit of the ADC of FIG. 1 in accordance with an embodiment of the present invention.

Referring to FIG. 2, a schematic block diagram of the sample and hold circuit 102 and the preamplifier circuit 104 in accordance with an embodiment of the present invention is shown. The sample-and-hold circuit 102 receives the differential input signal V+, V− and the common mode voltage Vcm, and outputs the sampled differential voltage V1, V2. The preamplifier circuit 104 receives the sampled differential voltage V1, V2 from the sample-and-hold circuit 102 and generates the amplified differential voltage Vo− and Vo+.

The sample and hold circuit 102 includes first through fourth switches 202a, 202b, 204a, and 204b, and first and second sampling capacitors 206a and 206b. The first and second switches 202a and 202b are activated when the sample-and-hold circuit 202 is in a sampling mode per a first phase Φs of a clock signal, and the third and fourth switches 204a and 204b are activated when the sample-and-hold circuit 202 is in an amplification or hold mode per a second phase Φa of the clock signal (i.e., the first phase Φs of the clock signal indicates a sampling phase and the second phase Φa of the clock signal indicates an amplification phase). In the preferred embodiment, the first and second phases Φs and Φa of the clock signal are non-overlapping.

When the sample-and-hold circuit 202 operates in the sampling phase, the first and second switches 202a and 202b are activated (closed), and the first and second sampling capacitors 206a and 206b store the differential input voltage V+ and V−, respectively. When the sample-and-hold circuit 202 operates in the amplification phase, the third and fourth switches 204a and 204b are activated, and the first and second sampling capacitors 206a and 206b store the common-mode voltage Vcm. Thus, during the amplification phase, the sampled differential voltage V1 output by the sample-and-hold circuit 202 is based on the sum of the differential input voltage V+ and the common-mode voltage Vcm, and voltage V2 is based on the sum of the voltage V− and the common-mode voltage Vcm.

The preamplifier circuit 104 has an input stage 208, which includes a first transconductor 210, a load 212, and fifth and sixth switches 214a and 214b. The first transconductor 210 receives the sampled differential voltage V1, V2 from the sample-and-hold circuit 202 and generates a first amplified differential voltage V1amp− and V1amp+. The load is connected to the output of the first transconductor and receives the first amplified differential voltage V1amp−, V1amp+.

More particularly, the first transconductor 210 has a first, positive or non-inverting input terminal and a second, negative or inverting input terminal, which are connected to the sample-and-hold circuit 202 for receiving the sampled differential voltage V1 and V2, respectively, and a first, inverting output terminal and a second, non-inverting output terminal for outputting the first amplified differential voltage V1amp− and V1amp+, respectively.

The fifth switch 214a is connected between the first output terminal and the first input terminal, and the sixth switch 214b is connected between the second output terminal and the second input terminal. The fifth and sixth switches 214a and 214b both are active/closed in the sample mode per the first phase Φs of the clock signal (and consequently inactive in the amplification mode), and thus, first and second negative feedback paths are formed during the sampling phase.

As will be explained in more detail with reference to FIG. 3, a first offset voltage V1$_{offset}$ is present at the first output terminal when the fifth switch 214a is activated and the first output terminal is coupled to the first input terminal. The first offset voltage V1$_{offset}$ then is stored on the first sampling capacitor 206a. Similarly, a second offset voltage V2$_{offset}$ is present at the second output terminal when the sixth switch 312b is activated and the second output terminal is coupled to the second input terminal. The second offset voltage V2$_{offset}$ then is stored on the second sampling capacitor 206b. The first and second offset voltages V1$_{offset}$ and V2$_{offset}$ are based on offset noise of the preamplifier circuit 104.

The load 212, which preferably is a passive load, such as a resistor, capacitor or inductor, or a combination thereof, is connected to the output terminals of the first transconductor 210 by way of first and second nodes N1 and N2. The amplified differential output voltage Vo−, Vo+ also is generated at the first and second nodes N1 and N2. However, in alternative embodiments, the load could include circuit elements that are current or voltage controlled (and hence be an active load).

The input stage 208 also includes a floating transconductor 216, seventh and eighth switches 218a and 218b, and first and second feedback capacitors 220a and 220b. As will be discussed in more detail below, the floating transconductor 216 employs passive positive-feedback to boost the output voltage of the preamplifier circuit 104 in the amplification mode. The first and second feedback capacitors enable the floating transconductor to operate as a positive feedback amplifier during the amplification phase Φa of the preamplifier circuit 104. An output of the floating transconductor 216 is connected to the output of the first transconductor 210 and the input of the load 212 by way of the first and second nodes N1 and N2.

More particularly, the floating transconductor 216 has a third, inverting input terminal, a fourth, non-inverting input terminal, a third, non-inverting output terminal, and a fourth, inverting terminal. The third and fourth output terminals provide a second amplified differential voltage V2amp+ and V2amp−, respectively.

The third output terminal is connected to the third input terminal by way of the seventh switch 218a, and the fourth output terminal is connected to the fourth input terminal by way of the eighth switch 218b. The seventh and eighth switches are controlled by the first phase Φs of the clock signal. The third output terminal also is connected to fourth input terminal by way of the second feedback capacitor 220b, while the fourth output terminal is connected to the third input terminal by way of the first feedback capacitor 220a. The first and second feedback capacitors 220a and 220b form positive feedback paths.

Further, the third output terminal (of the floating transconductor 316) is connected to the second output terminal (of the first transconductor 210) and to the load 212 by way of the second node N2, and the fourth output terminal (of the floating transconductor 216) is connected to the first output terminal (of the first transconductor 210) and to the load 212 by way of the first node N1. Thus, the first output terminal of the first transconductor 210 is connected to the third input terminal of the floating transconductor 216 by way of the first node N1 and the first feedback capacitor 220a, and the second output terminal of the first transconductor 210 is connected to the fourth input terminal of the floating transconductor 216 by way of the second node N2 and the second feedback capacitor 220b, so the floating transconductor 216 receives the first amplified voltage V1amp− and V1amp+ at its input terminals.

As previously noted, the amplified differential output voltage Vo−, Vo+ is generated at the first and second nodes N1 and N2, such that Vo− is based on V1amp− and v2amp− and v0+ is based on V1amp+ and V2amp+.

A third offset voltage $V3_{offset}$ is present at the third output terminal during the sampling phase when the seventh switch 218a is closed and the third output terminal is coupled to the third input terminal. The third offset voltage $V3_{offset}$ is stored on the second feedback capacitor 220b. Similarly, a fourth offset voltage $V4_{offset}$ is present at the fourth output terminal during the sampling phase when the eighth switch 218b is closed and the fourth output terminal is coupled to the fourth input terminal. The fourth offset voltage $V4_{offset}$ is stored on the first feedback capacitor 220a. Thus, negative feedback paths are formed in the sampling phase when the seventh and eighth switches 218a and 218b are closed.

As previously noted, the first feedback capacitor 220a is connected between the fourth output terminal and the third input terminal, while the second feedback capacitor 220b is connected between the third output terminal and the fourth input terminal. However, the first feedback capacitor 220a also is connected to the first output terminal by way of the first node N1, and so receives the first amplified voltage V1amp− during the amplification phase. Similarly, the second feedback capacitor 220b is connected to the second output terminal by way of the second node N2, so receives the first amplified voltage V1amp+ during the amplification phase. Thus, during the sampling phase, when Φs is active, the sample-and-hold circuit 102 and the positive-feedback capacitors 220a and 220b together store the combined offset voltages of the first and floating transconductors 210 and 216.

The preamplifier circuit 104 uses the input stage 208 comprising the first transconductor 210 and the parallel connected passive or active load 212. Offset is stored on the sampling capacitors 206a and 206b during the sampling phase (φs). To boost the speed of the first transconductor 210, a floating transconductor 216 is connected in parallel therewith. This implementation avoids the need for dedicated Vcm levels. The floating transconductor 216 is self-biased from the common-mode voltage of the first transconductor 210 during the sampling phase φs. The first and floating transconductors 210 and 216 both store their own offsets, hence offset is cancelled. During amplification phase (pa, the floating transconductor 216 has positive feedback provided by the feedback capacitors 220a and 220b. The first transconductor 210 sees parasitic load of a next-stage and an output parasitic capacitance of the floating transconductor 216, which is directly driven by the first transconductor 210. This arrangement avoids capacitive division of the output due to parasitics, and hence leads to higher speed and amplification. One important aspect of this implementation is that the first and floating transconductors 210 and 216 are connected in such a way that the total current consumption is the same as in a conventional preamplifier having a single transconductor stage. The first and floating transconductors 210 and 216 also can be dynamic, even though this implementation uses fixed-bias for tail-current. The floating transconductor 216 can be smaller than the first transconductor 210 as its main purpose is to provide positive feedback to boost the gain when the output of the first transconductor 210 is still small.

Figure 3:
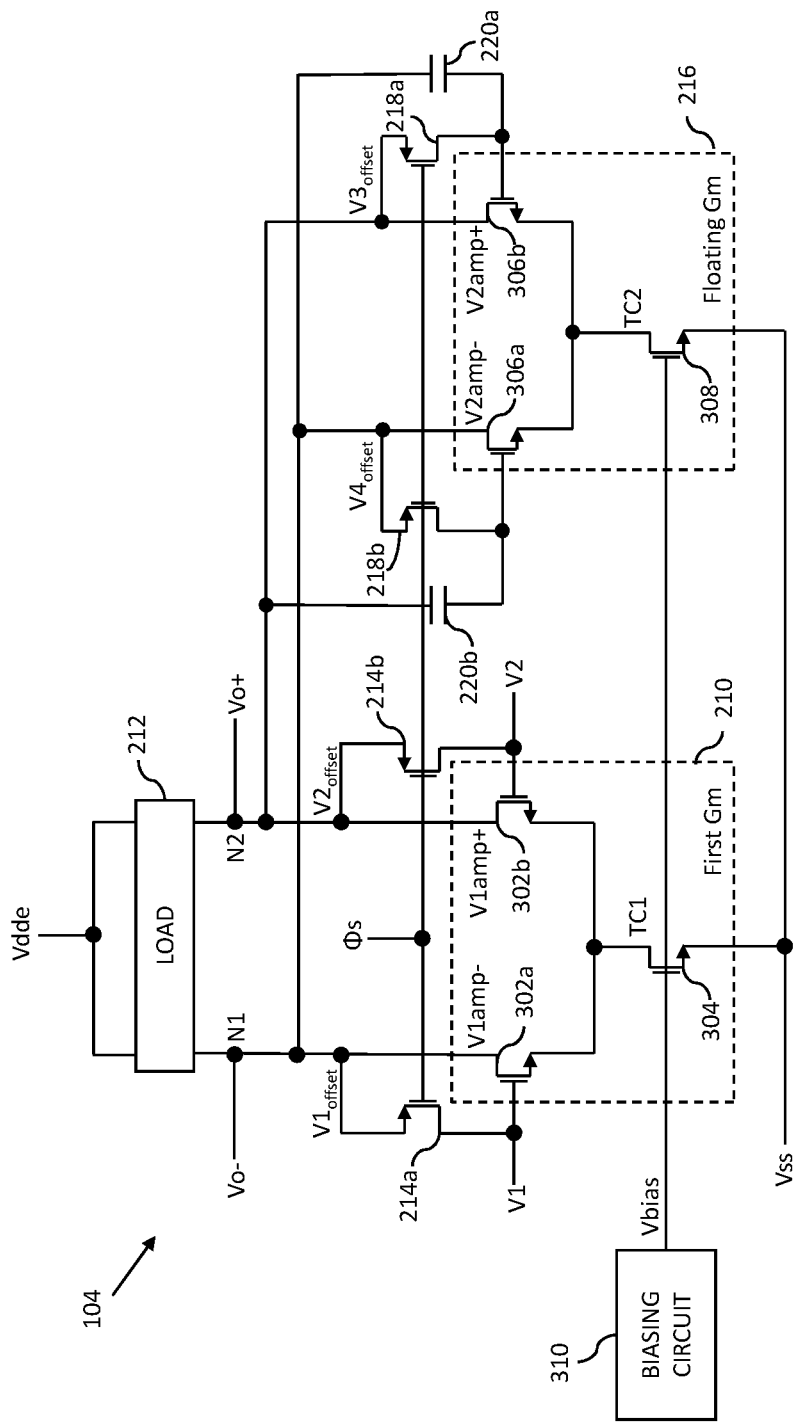
FIG. 3 is a schematic circuit diagram of the preamplifier circuit of FIG. 2 in accordance with an embodiment of the present invention.

Referring now to FIG. 3, a schematic circuit diagram of the preamplifier circuit 104 in accordance with an embodiment of the present invention is shown. The first transconductor 208 includes first and second transistors 302a and 302b, and a first tail current source 304. The floating transconductor 216 includes third and fourth transistors 306a and 306b, and a second tail current source 308. In one embodiment, the first through fourth transistors 302a, 302b, 306a and 306b and the first and second tail current sources 304 and 308 are NMOS transistors.

The first tail current source 304 has a first terminal connected to a biasing circuit 310 for receiving a bias voltage, a second terminal connected to a second supply voltage Vss, and a third terminal that provides a first tail current TC1. The first transistor 302a has a gate connected to the sample-and-hold circuit 102 for receiving the first differential voltage V1, a source connected to the third terminal of the first tail current source 304 for receiving the first tail current TC1, and a drain that provides the amplified first voltage V1amp−. The second transistor 302b has a gate connected to the sample-and-hold circuit 102 for receiving the first differential voltage V2, a source connected to the third terminal of the first tail current source 304 for receiving the first tail current TC1, and a drain that provides the first amplified voltage V1amp+.

The second tail current source 308 has a first (gate) terminal connected to the biasing circuit 310 for receiving the bias voltage, a second (source) terminal that receives the second supply voltage Vss, and a third (drain) terminal that provides a second tail current TC2. The third transistor 306a has a gate connected to the drain of the second transistor 302b by way of the second feedback capacitor 220b (and the second node N2) for receiving the amplified voltage V1amp+, a source connected to the third terminal of the second tail current source 308 for receiving the second tail current TC2, and a drain that provides the second amplified voltage V2amp−. The fourth transistor 306b has a gate connected to the drain of the first transistor 302a by way of the first feedback capacitor 220a (and the first node N1) for receiving the amplified first voltage V1amp−, a source connected to the third (drain) terminal of the second tail current source 308 for receiving the second tail current TC2, and a drain that provides the second amplified voltage V2amp+. In one embodiment, the first tail current TC1 has a higher value (preferred) than the second tail current TC2. This is achieved by using different values of current-mirror ratio formed by TC1, TC2 and biasing circuit from the biasing circuit 310.

The fifth switch 214a has a gate that receives the first phase Φs of the clock signal, and source and drain terminals connected to the drain and gate terminals of the first transistor 302a so that the first offset voltage $V1_{offset}$ is transmitted from the drain of the first transistor 302a to its gate by way of the fifth switch 214a. The sixth switch 214b has a gate that receives the first phase Φs of the clock signal, and source and drain terminals connected to the drain and gate terminals of the second transistor 302b so that the second offset voltage $V2_{offset}$ is transmitted from the drain of the second transistor 302b to its gate by way of the sixth switch 214b.

The seventh switch 218a has a gate that receives the first phase Φs of the clock signal, and source and drain terminals connected to the drain and gate terminals of the fourth transistor 306b for transmitting the third offset voltage $V3_{offset}$ from the drain of the fourth transistor 306b to its gate by way of the seventh switch 218a. The eighth switch 218b has a gate that receives the first phase Φs of the clock signal, and source and drain terminals connected to the drain and gate terminals of the third transistor 306a for transmitting the fourth offset voltage $V4_{offset}$ from the drain of the third transistor 306a to its gate by way of the eighth switch 218b. In one embodiment, the fifth through eighth switches 214a, 214b, 218a, and 218b are PMOS transistors.

During the sampling phase Φs, the fifth through eighth switches 214a, 214b, 218a, and 218b are activated/closed. Thus, the first and second offset voltages $V1_{offset}$ and $V2_{offset}$ are stored on the first and second sampling capacitors 206a and 206b, respectively. The first and second sampling capacitors 206a and 206b also store the differential input voltage V+ and V−, respectively. Similarly, the third and fourth offset voltages $V3_{offset}$ and $V4_{offset}$ are stored on the first and second feedback capacitors 220a and 220b, respectively.

During the amplification phase Φa, the third and fourth switches 204a and 204b (FIG. 2) are activated/closed. Thus, the common-mode voltage Vcm is provided to the first and second sampling capacitors 206a and 206b. The first sampling capacitor 206a stores the common-mode voltage Vcm, the input voltage V+ and the first offset voltage $V1_{offset}$, such that V1 equals the sum of Vcm, V+ and $V1_{offset}$. Similarly, the second sampling capacitor 206b stores the common-mode voltage Vcm, the analog voltage V− and the second offset voltage $V2_{offset}$, such that V2 equals the sum of Vcm, V− and $V2_{offset}$. Thus, the gate of the first transistor 302a receives the sum of V+, $V1_{offset}$, and Vcm and outputs the amplified first voltage V1amp− at its drain terminal. Similarly, the gate of the second transistor 302b receives the sum of V−, $V2_{offset}$ and Vcm and outputs the amplified voltage V1amp+ at its drain terminal.

The third transistor 306a receives the amplified voltage V1amp+ at its gate by way of the second feedback capacitor 220b, and outputs the amplified voltage V2amp− at its drain terminal. The fourth transistor 306b receives the amplified voltage V1amp− at its gate by way of the first feedback capacitor 220a, and outputs the amplified voltage V2amp+ at its drain terminal. The output voltage Vo− generated at the first node N1 is thus a sum of the amplified voltages V1amp− and V2amp−, and the output voltage Vo+ generated at the second node N2 is a sum of the amplified voltages V1amp+ and V2amp+.

The preamplifier circuit 104 can be implemented using a different arrangement of transistors or different types of transistors. For example, in an alternate implementation, the first through fourth transistors 302a, 302b, 306a, and 306b may comprise PMOS transistors, and the fifth through eighth switches 214a, 214b, 218a, and 218b may comprise NMOS transistors.

The first and second feedback capacitors 220a and 220b provide passive positive feedback, so the speed and gain of the preamplifier circuit 104 are enhanced without consuming additional power. Thus, the preamplifier circuit 104 may be implemented in high-resolution and high-speed ADCs.

The first through fourth offset voltages $V1_{offset}$-$V4_{offset}$ are stored on the first and second sampling capacitors 206a and 206b, and the first and second feedback capacitors 220a and 220b. The differential output voltage Vo−, Vo+ is amplified based on the first through fourth offset voltages $V1_{offset}$-$V4_{offset}$, which reduces the effects of offset and kickback noise. Further, due to the reduction in the effect of offset and kickback noise, errors in the first and second digital signals D1 and D2 (FIG. 1) at various process corners are reduced. Thus, the ADC 100 performs well at high operating frequencies.

Due to the absence of sampling capacitors in the preamplifier circuit 104, the amplitudes of the output voltage Vo−, Vo+ is not affected by capacitive division. Thus, the operating speed of the preamplifier circuit 104 is improved as compared to conventional preamplifier circuits.

The floating transconductor 216 is driven by the first transconductor 210. Hence, the floating transconductor 216 is not connected to any circuitry that is external to the preamplifier circuit 104. Further, the first and second transistors 302a and 302b and the third and fourth transistors 306a and 306b are biased by two independent current sources (i.e., the first and second tail current sources 304 and 308, respectively) and not by a common current source. Thus, the input capacitance of the preamplifier circuit 104 is lower than the input capacitance of conventional preamplifier circuits. Additionally, the first through fourth transistors 302a, 302b, 306a, and 306b may be smaller than the transistors in conventional preamplifier circuits. Thus, the preamplifier circuit 104 consumes less chip area.

The present invention provides passive positive-feedback at the output of the preamplifier using the floating transconductor stage, which boosts the speed of the preamplifier circuit through novel biasing and output capturing circuitry.

It will be understood by those of skill in the art that the same functions may be performed by different arrangements of transistors that may operate using either high active or low active signals. Therefore, variations in the arrangement of some of the transistors described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An article of manufacture comprising a preamplifier circuit that receives a differential input voltage V1, V2 and generates a differential output voltage Vo−, Vo+, wherein the preamplifier circuit comprises:

an input stage including a first transconductor and a load, wherein the first transconductor receives the differential input voltage V1, V2 and generates a first amplified differential voltage V1amp−, V1amp+, and the load is connected to and receives the first amplified differential voltage V1amp−, V1amp+ from the first transconductor by way of first and second nodes N1 and N2; and a floating transconductor that generates a second amplified differential voltage V2amp−, V2amp+, wherein the second amplified differential voltage is connected to the load by way of the first and second nodes N1, N2 such that the output of the floating transconductor is connected in parallel with the output of the first transconductor, and wherein the floating transconductor employs passive positive-feedback to boost the differential output voltage Vo−, Vo+ in an amplification phase.

2. The article of claim 1, wherein the passive positive feedback comprises:

first and second feedback capacitors that enable the floating transconductor to operate as a positive feedback amplifier during the amplification phase.

3. The article of claim 2, wherein the first and second feedback capacitors also store combined offset voltages of the first and floating transconductors.

4. The article of claim 2, wherein:

the first feedback capacitor has a first terminal connected to an inverting output terminal of the floating transconductor and a second terminal connected to an inverting input terminal of the floating transconductor; and the second feedback capacitor has a first terminal connected to a non-inverting output terminal of the floating transconductor and a second terminal connected to a noninverting input terminal of the floating transconductor.

5. The article of claim 4, wherein the preamplifier circuit further comprises:

a first switch connected between an inverting output terminal and a non-inverting input terminal of the first transconductor; and a second switch connected between a non-inverting output terminal and an inverting input terminal of the first transconductor, wherein the first and second switches are turned on during a sampling phase of the preamplifier circuit.

6. The article of claim 5, wherein the preamplifier circuit further comprises:

a third switch connected between the non-inverting output terminal and the inverting input terminal of the floating transconductor; and a fourth switch connected between the inverting output terminal and the non-inverting input terminal of the floating transconductor, wherein the third and fourth switches are turned on during the sampling phase.

7. The article of claim 2, further comprising a driving circuit connected to the preamplifier circuit, wherein the input stage of the preamplifier circuit receives the differential input voltage V1, V2 from the driving circuit.

8. The article of claim 7, wherein the driving circuit comprises a sample-and-hold circuit.

9. The article of claim 8, wherein the sample-and-hold circuit stores first and second offset voltages of the first transconductor during a sampling phase of the preamplifier circuit.

10. The article of claim 9, wherein the sample-and-hold circuit and the first and second feedback capacitors together store combined offset voltages of the first and floating transconductors during the sampling phase of the preamplifier circuit.

11. The article of claim 9, wherein the sample-and-hold circuit comprises:

a first sampling capacitor having a first terminal connected to a noninverting input terminal of the first transconductor;

a second sampling capacitor having a first terminal connected to an inverting input terminal of the first transconductor, wherein the differential input voltage V1, V2 is provided to the input stage from the first terminals of the first and second sampling capacitors;

a first switch connected between a first input terminal of the sample-and-hold circuit and a second terminal of the first sampling capacitor, wherein the first input terminal receives a first component V+ of a differential input voltage;

a second switch connected between a second input terminal of the sample-and-hold circuit and a second terminal of the second sampling capacitor, wherein the second input terminal receives a second component V− of the differential input voltage;

a third switch connected between a third input terminal of the sample-and-hold circuit and the second terminal of the first sampling capacitor, wherein the third input terminal receives a common mode voltage Vcm; and a fourth switch connected between the third input terminal of the sample-and-hold circuit for receiving the common mode voltage and the second terminal of the second sampling capacitor, wherein the first and second switches are activated in a sampling phase and the third and fourth switches are activated in the amplification phase.

12. A preamplifier circuit that receives a differential input voltage V1, V2 and generates a differential output voltage Vo−, Vo+, the preamplifier circuit comprising:

a first transconductor connected to an external driving circuit for receiving the differential input voltage V1, V2 therefrom, and having first and second output terminals that respectively output a first amplified differential output voltage V1amp−, V1amp+;

a load having connected to the first and second output terminals of the first transconductor for receiving the first amplified differential output voltage V1amp−, V1amp+ by way of respective first and second nodes N1 and N2; and a floating transconductor having first and second output terminals that provides a second amplified differential output voltage V2amp−, V2amp+, respectively, wherein the first output terminal of the floating transconductor is connected to the load by way of the first node, and the second output terminal of the floating transconductor is connected to the load by way of the second node such that the output of the floating transconductor is connected in parallel with the output of the first transconductor, and wherein the floating transconductor employs passive positive-feedback to boost the differential output voltage Vo−, Vo+ in an amplification phase.

13. The preamplifier circuit of claim 12, wherein the first transconductor comprises:

a first transistor having a gate connected to the external driving circuit for receiving a first component V1 of the differential input voltage, and a drain that provides a first component of the first amplified differential output voltage V1amp− to the first node N1;

a second transistor having a gate connected to the external driving circuit for receiving a second component V2 of the differential input voltage, a source terminal connected to a source terminal of the first transistor, and a drain that provides a second component of the first amplified differential voltage V1amp+ to the second node N2; and a first tail current source that receives a biasing voltage and outputs a first tail current to the source terminals of the first and second transistors, and wherein the floating transconductor comprises:

a third transistor having a gate connected to the drain of the second transistor, and a drain that provides a first component of the second amplified differential output voltage V2amp− to the first node N1;

a fourth transistor having a gate connected to the drain of the first transistor, a source terminal connected to a source terminal of the third transistor, and a drain that provides a second component of the second amplified differential output voltage V2amp+ to the second node N2; and a second tail current source that receives the biasing voltage and outputs a second tail current to the source terminals of the third and fourth transistors.

14. The preamplifier circuit of claim 13, further comprising:

a first switch connected between the drain and gate terminals of the first transistor; and a second switch connected between the drain and gate terminals of the second transistor, wherein the first and second switches are activated in a sampling phase of the preamplifier circuit.

15. The preamplifier circuit of claim 14, further comprising:

a first feedback capacitor connected between the drain terminal of the third transistor and the gate terminal of the fourth transistor; and a second feedback capacitor connected between the drain terminal of the fourth transistor and the gate terminal of the third transistor, wherein the first and second feedback capacitors enable the floating transconductor to operate as a positive feedback amplifier.

16. The preamplifier circuit of claim 15, further comprising:

a third switch connected between the drain and gate terminals of the fourth transistor; and a fourth switch connected between the drain and gate terminals of the third transistor, wherein the third and fourth switches are activated in the sampling phase.

17. The preamplifier circuit of claim 14, wherein the first through fourth transistors are n-channel metal oxide semiconductor (NMOS) transistors.

* * * * *